(12) United States Patent
Chittipeddi

(10) Patent No.: US 6,426,263 B1
(45) Date of Patent: Jul. 30, 2002

(54) METHOD FOR MAKING A MERGED CONTACT WINDOW IN A TRANSISTOR TO ELECTRICALLY CONNECT THE GATE TO EITHER THE SOURCE OR THE DRAIN

(75) Inventor: Sailesh Chittipeddi, Allentown, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/636,447

(22) Filed: Aug. 11, 2000

(51) Int. Cl.[7] .................... H01L 21/336; H01L 21/44
(52) U.S. Cl. ............... 438/281; 438/301; 438/586; 438/595; 438/620; 438/675; 438/687
(58) Field of Search .................. 438/281, 666, 438/620, 621, 675, 687, 301, 586, 595; 257/773

(56) References Cited

U.S. PATENT DOCUMENTS

| | | | |
|---|---|---|---|
| 4,821,089 A | | 4/1989 | Strauss ..................... 357/68 |
| 5,795,820 A | * | 8/1998 | Kepler |
| 5,895,269 A | * | 4/1999 | Wang et al. |
| 5,899,742 A | * | 5/1999 | Sun |
| 5,940,735 A | * | 8/1999 | Mehta et al. |
| 5,990,524 A | * | 11/1999 | En et al. |
| 6,083,827 A | * | 7/2000 | Lin et al. |
| 6,258,679 B1 | * | 7/2001 | Burns et al. |
| 6,287,953 B1 | * | 9/2001 | Sander et al. ............. 438/618 |
| 6,306,741 B1 | * | 10/2001 | Lee et al. ................. 438/585 |

OTHER PUBLICATIONS

"Borderless Contacts Trimmed by Embedded Line Conductor in an Organic Insulator," IBM Technical Disclosure Bulletin, vol. 32, No. 12, pp. 142–143, May 1990.*

F. White et al., "Damascene Stud Local Interconnect in CMOS Technology," IEEE Technical Digest of the 1992 International Electron Devices Meeting, pp. 301–304, Dec. 1992.*

* cited by examiner

Primary Examiner—Keith Christiansen
Assistant Examiner—Stephen W. Smoot

(57) ABSTRACT

The invention includes a method for manufacturing a merged contact in a window, comprising opening a window to one of a source and a drain of a field effect transistor and to and only partially overlapping a gate electrode of the field effect transistor, and depositing an electrical conductor connecting the gate electrode with one of the source and the drain to provide a merged contact between the gate and one of the source and the drain. Also described are devices made thereby.

13 Claims, 3 Drawing Sheets

METHOD FOR MAKING A MERGED CONTACT WINDOW IN A TRANSISTOR TO ELECTRICALLY CONNECT THE GATE TO EITHER THE SOURCE OR THE DRAIN

FIELD OF THE INVENTION

This invention relates to integrated circuits and methods of fabricating integrated circuits.

BACKGROUND OF THE INVENTION

The manufacture of circuits on semiconductor wafers begins with "front end", which is the creation of circuit elements and devices like field effect transistors (FETs) and capacitors. These devices are covered by a dielectric layer and then "windows" are opened in the dielectric layer over the device contacts and extend all the way through the dielectric. The windows are filled with an electrical conductor material to create an electrically conductive via that brings the device contacts, such as to the source, gate and drain of an FET, to the surface of the dielectric. There, the vias are connected to each other at the top of the dielectric layer to connect the devices into various circuit patterns. The levels (there are usually more than one) where the interconnection of the devices occur are known as the back end. It is desirable that as many device connections be made at the front end as possible. By doing this, the number of interconnect levels required can be reduced, the area occupied by a circuit reduced, signal transit time is shortened, leakage is reduced and general circuit performance and yield is increased.

SUMMARY OF THE INVENTION

The invention includes a method for manufacturing a merged contact in a window, comprising opening a window to one of a source and a drain of a field effect transistor and to and only partially overlapping a gate electrode of the field effect transistor, and depositing an electrical conductor connecting the gate electrode with one of the source and the drain to provide a merged contact between the gate and one of the source and the drain. Also described are integrated circuit devices made thereby, such as a field effect transistor comprising a source, a gate, a gate electrode and a drain, the field effect transistor having a merged contact electrically connecting a gate electrode of the field effect transistor and one of the drain and the source of the field effect transistor.

BRIEF DESCRIPTION OF THE DRAWINGS

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

A common integrated circuit device is the FET. An FET is provided with three contacts, one each for the gate, the source and the drain of the FET. The source and the drain are given different names for the ease of circuit designers to designate where the current goes in and comes out. However, the physical structure of an FET is such that the source and drain may be symmetrical about the gate and may be, and are herein, used interchangeably, since the focus of the discussion is on the manufacture of FET. Thus, consistent with industry use, when it is said that a lightly doped drain (LDD) is being made, a lightly doped source is also made (no corresponding acronym, due to symmetry).

Occasionally, FETs are connected in a circuit so that the source or the drain is connected to the gate. The present invention merges the contacts of the gate and the source (or drain) by creating a window over the source that partially extends over the gate. This window is then filled with an electrical conductor material that provides a single, merged contact for both the gate and the source, connecting them together.

Figure 1:
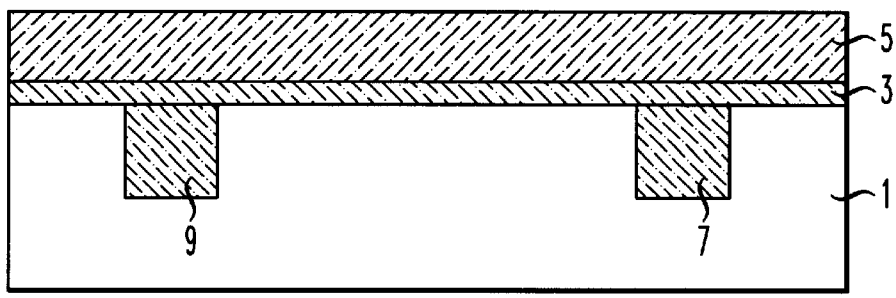
FIG. 1 is a cross-sectional view of a silicon substrate with a layer of $SiO_2$ gate oxide over the silicon, boron phosphorus doped silicate glass over the $SiO_2$ and two shallow trench isolation regions, between which an FET will be formed, for one embodiment of the invention.

Referring now to the drawing, wherein like reference numerals refer to like elements throughout, FIG. 1 is a cross-sectional view of a semiconductor substrate 1, like silicon, with a gate oxide layer 3 over substrate 1, for one exemplary process for fabricating the invention described herein. A layer 5 with an etch rate differential to the gate oxide layer 3 is deposited over gate oxide layer 3. Boron phosphorus doped silicate glass is preferred, and may be deposited by plasma enhanced boron phosphorus tetraethylorthosilicate or as a spin-on glass. Two optional shallow trench isolation regions 7 and 9 are shown, between which an FET will be formed, for one embodiment of the invention. Shallow trench isolation regions 7 and 9 provide desirable electrical isolation between adjacent transistors.

Figure 2:
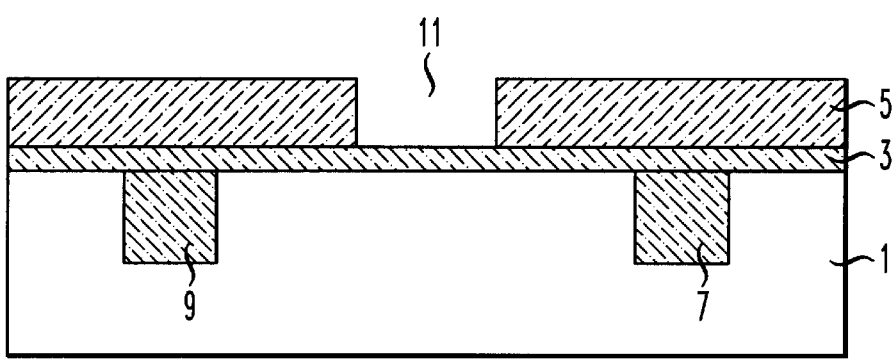
FIG. 2 is a view of the above after photoresist deposition, photoresist patterning, etching (selective for the glass) and photoresist removal to form a trench in the boron phosphorus doped silicate glass over the gate oxide, for one embodiment of the invention.

Photoresist deposition, photoresist patterning, etching (selective for layer 5) and photoresist removal is then done to form a trench 11 in layer 5, as can be seen in FIG. 2.

Figure 3:
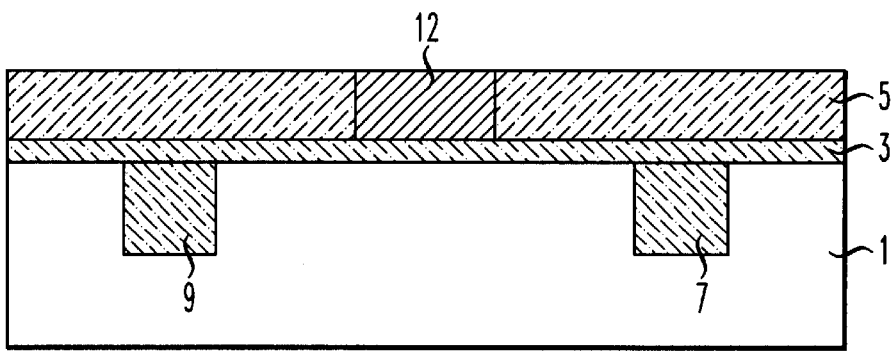
FIG. 3 shows the above after filling the trench with a gate electrode material and planarizing, for one embodiment of the invention.

The trench 11 is then filled with electrically conductive material and planarized to form a gate electrode 12, shown in FIG. 3. The electrically conductive material closest to the gate oxide 3 is preferably, but not necessarily, doped polysilicon. Other electrically conductive materials that can be used alone or in combination include TiN, Cu, Al, aluminum alloys, Ta, Ti and $WSi_x$.

Figure 4:
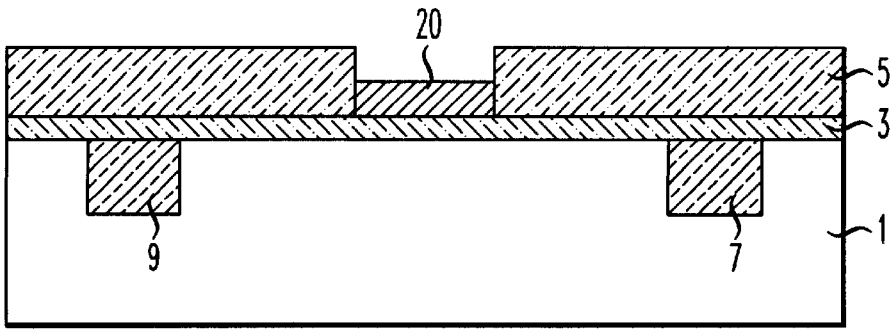
FIG. 4 is a view of the above after the gate electrode material has been partially etched away, for an embodiment of the invention.

The gate electrode 12 is then partially etched away, as seen in FIG. 4. Note that if the partially etched gate electrode 20 is doped polysilicon, it may be optionally silicided with a metal at this step.

Figure 5:
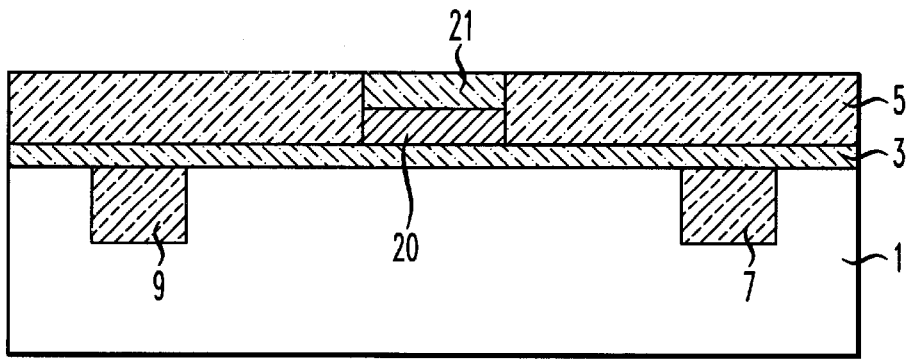
FIG. 5 is a view of the above after depositing $SiO_2$ and planarizing, for an embodiment of the invention.
Figure 6:
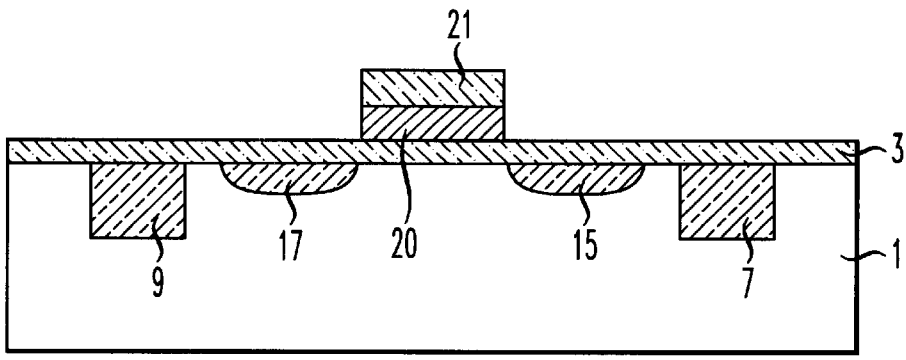
FIG. 6 is a view of the above after etching away the boron phosphorus doped silicate glass, leaving gate electrode with $SiO_2$ on top and masking, patterning and implanting LDD regions, for an embodiment of the invention.

A dielectric material 21, having an etch rate differential with respect to layer 5, is deposited and planarized, as seen in FIG. 5. The dielectric material 21 is preferably $SiO_2$, which may be deposited by plasma enhanced tetraethylorthosilicate, for example. Layer 5 is then etched away, leaving gate electrode 20 with dielectric 21 on top, as shown in FIG. 6.

Figure 7:
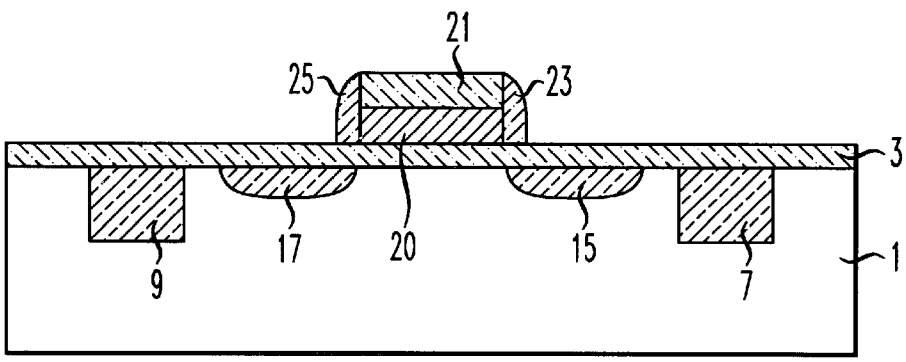
FIG. 7 is a view of the above after silicon nitride spacer deposition and etch, for an embodiment of the invention.

Dielectric spacers 25 and 23, such as silicon nitride or silicon dioxide, for example, are deposited and etched, as can be seen in FIG. 7.

Figure 8:
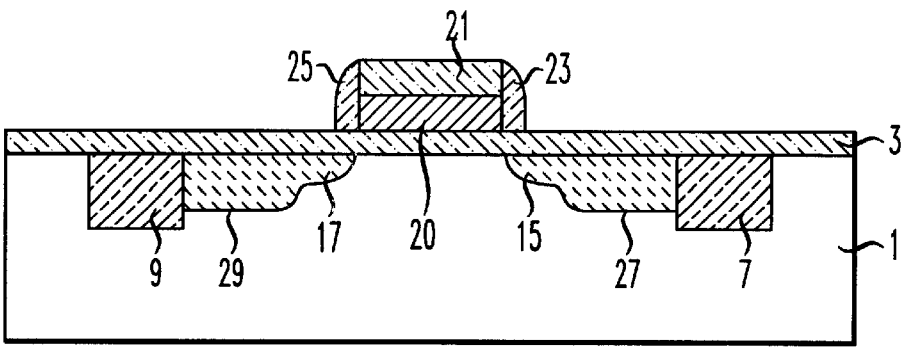
FIG. 8 is a view of the above after anneal to drive the LDD diffusion and source and drain implantation, for an embodiment of the invention.

Annealing to drive the conventionally formed LDD 15 and 17 structures of FIG. 7 and implanting to form the source 29 and drain 27 is shown in FIG. 8.

Figure 9:
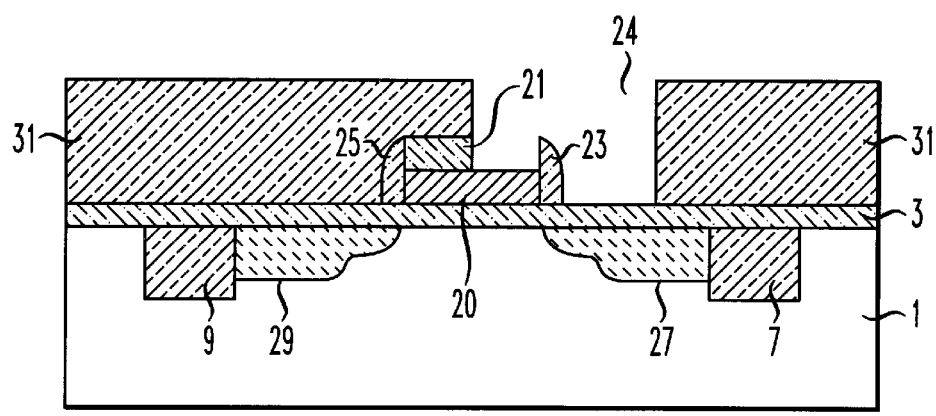
FIG. 9 is a view of the above after dielectric deposition, patterning with photoresist to leave a window above the source or drain and partially over the gate, and etching down to the source or drain and gate, for an embodiment of the invention.

Dielectric 31 deposition, patterning with photoresist to leave a window 24 to the drain 27 (or source 29, if mirror image) and to and partially over the gate electrode 20, and etching down to the drain 27 (or source 29, if mirror image) and gate electrode is then done, as seen in FIG. 9. The window is only partially over the gate so as not to short out to the source 29.

Figure 10:
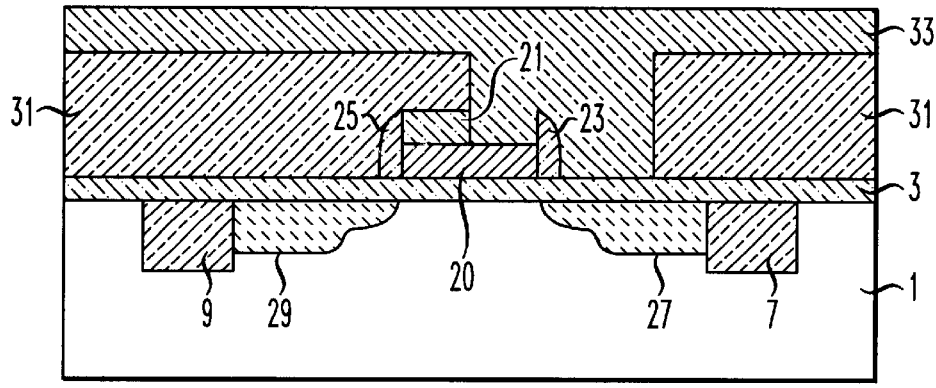
FIG. 10 is a view of the above after depositing an electrical conductor material to provide a merged contact to both the source or drain and the gate within the window gate, for an embodiment of the invention.

An electrical conductor material 33 to provide a merged contact, as opposed to discrete contacts, contacting both the drain 27 and the gate electrode 20, as shown in FIG. 10. The electrical conductor material 33 is preferably copper, but it can also be aluminum or an aluminum alloy, for example. Planarization is then normally done (not shown), followed by trench formation and fill, additional interconnect layers and the like.

Note that dielectric layer 21 or spacer 23, or both, would not be present in alternative embodiments of the invention. Dielectric spacer 23 may be etched away at the point in the process illustrated in FIG. 9. If LDD implant is done earlier in the process than the step illustrated in FIG. 6, then gate electrode 12 would proceed in flow without having to be etched and topped with a dielectric such as 21. In the alternative embodiment (not shown) of LDD implant earlier than the step shown in FIG. 6, a hardmask such as silicon nitride may then be deposited and patterned and LDD implant done. The hardmask is etched, which also selectively removes the original gate electrode 12, and the original gate electrode is replaced with a new gate electrode that is deposited and planarized. Note that prior to depositing a new gate electrode, the gate oxide may optionally be etched and regrown.

Although the invention has been described with reference to illustrative embodiments, it is not limited to those embodiments. Rather, the appended claims should be construed to include other variants and embodiments of the invention that may be made by those skilled in the art without departing from the true spirit and scope of the present invention.

What is claimed is:

1. A method for manufacturing a merged contact in a window, comprising:

forming a gate oxide on a semiconductor substrate;

forming a material having an etch rate differential to the gate oxide over the gate oxide;

patterning and etching a trench down to the gate oxide into the material having an etch rate differential;

filling the trench with a gate electrode and over the gate oxide;

forming a source and a drain;

etching away the material having an etch rate differential;

opening a window to one of the source and the drain of a field effect transistor and to and only partially overlapping the gate electrode of the field effect transistor; and depositing an electrical conductor connecting the gate electrode with one of the source and the drain to provide a merged contact between the gate and one of the source and the drain.

2. The method for manufacturing a merged contact in a window of claim 1, wherein the merged contact is made of a different material than at least one material of the gate electrode.

3. The method for manufacturing a merged contact in a window of claim 1, wherein the gate oxide is silicon dioxide.

4. The method for manufacturing a merged contact in a window of claim 1, wherein the semiconductor substrate is silicon.

5. The method for manufacturing a merged contact in a window of claim 1, wherein the gate electrode comprises doped polysilicon.

6. The method for manufacturing a merged contact in a window of claim 1, wherein the material having an etch rate differential to the gate oxide is boron phosphorus doped silicate glass.

7. The method for manufacturing a merged contact in a window of claim 1, further including depositing dielectric spacers on the gate electrode, wherein the dielectric spacers are silicon nitride.

8. The method for manufacturing a merged contact in a window of claim 1, further including depositing a dielectric layer over the gate electrode, wherein the dielectric layer is selected from the group consisting of silicon dioxide and spin-on glass.

9. The method for manufacturing a merged contact in a window of claim 1, wherein the electrical conductor is copper.

10. The method for manufacturing a merged contact in a window of claim 1, further comprising the step of planarizing the electrical conductor.

11. The method for manufacturing a merged contact in a window of claim 1, wherein the step of opening a window comprises depositing photoresist and patterning and etching.

12. The method for manufacturing a merged contact in a window of claim 1, further comprising the step of partially etching the gate electrode and covering the partially etched gate electrode with a second dielectric layer.

13. A method for manufacturing a merged contact in a window, comprising:

forming a gate oxide on a silicon substrate;

forming boron phosphorus doped silicate glass layer over the gate oxide;

patterning and etching a trench down to the gate oxide into the boron phosphorus doped silicate glass;

filling the trench with a gate electrode;

implanting a source and a drain;

annealing to drive the diffusion of the source and drain;

etching away the boron phosphorus doped silicate glass layer;

depositing silicon nitride spacers on the gate electrode;

depositing a dielectric layer selected from the group consisting of silicon dioxide and spin-on-glass;

depositing and patterning photoresist, and etching to open a window to one of the source and the drain of a field effect transistor and to and only partially overlapping the gate electrode of the field effect transistor;

depositing an electrical conductor connecting the gate electrode with one of the source and the drain to provide a merged contact between the gate and one of the source and the drain; and planarizing the electrical conductor.

* * * * *